(12) United States Patent
Furuta

(10) Patent No.: US 7,883,992 B2
(45) Date of Patent: Feb. 8, 2011

(54) WAFER DIVIDING METHOD

(75) Inventor: Kenji Furuta, Ota-Ku (JP)

(73) Assignee: Disco Corporation, Tokyo (JP)

( * ) Notice: Subject to any disclaimer, the term of this patent is extended or adjusted under 35 U.S.C. 154(b) by 75 days.

(21) Appl. No.: 12/275,884

(22) Filed: Nov. 21, 2008

(65) Prior Publication Data

US 2009/0170289 A1 Jul. 2, 2009

(30) Foreign Application Priority Data

Dec. 28, 2007 (JP) .............................. 2007-338749

(51) Int. Cl.
*H01L 21/00* (2006.01)

(52) U.S. Cl. ................ 438/462; 438/463; 257/E21.238; 257/E21.599

(58) Field of Classification Search ........................ None
See application file for complete search history.

(56) References Cited

U.S. PATENT DOCUMENTS 6,257,224 B1 * 7/2001 Yoshino et al. ........... 125/13.01

2006/0172509 A1 * 8/2006 Mahle et al. ................. 438/462

FOREIGN PATENT DOCUMENTS

JP    A 2005-95952    4/2005

* cited by examiner

*Primary Examiner*—Jarrett J Stark
(74) *Attorney, Agent, or Firm*—Greer, Burns & Crain, Ltd.

(57) ABSTRACT

A laser beam is applied to an intersection area of each second street of a wafer by using a dicing apparatus to thereby form a first modified layer along the intersection area. Thereafter, the wafer is divided along each first street intersecting each second street at right angles to obtain a plurality of wafer strips. Thereafter, the laser beam is applied along the remaining area of each second street other than the intersection area to form a second modified layer along the remaining area of each second street. Thereafter, an external force is applied to each wafer strip in which the first and second modified layers have been formed along each second street, thereby dividing each wafer strip along each second street to obtain a plurality of devices.

2 Claims, 5 Drawing Sheets

WAFER DIVIDING METHOD

BACKGROUND OF THE INVENTION

1. Field of the Invention

The present invention relates to a method of dividing a semiconductor wafer formed with a plurality of streets to partition a plurality of device forming areas from each other, and more particularly to a dividing method for a wafer strip.

2. Description of the Related Art

A semiconductor wafer (which will be hereinafter referred to simply as a wafer) is formed with a plurality of crossing streets (division lines) to partition a plurality of device forming areas in which a plurality of devices are respectively formed. After forming a device in each device forming area of the wafer, the wafer is polished, for example. Thereafter, the wafer is cut along the streets to obtain the individual devices (semiconductor chips). Examples of a wafer cutting method include a method using a cutting blade and a method of applying a laser beam along the streets to form slits on the wafer by utilizing a thermal evaporation phenomenon called ablation.

Known as another example of the wafer cutting method is a method including the steps of first forming a modified layer as a weak area inside the wafer and next applying an external force to the wafer to thereby divide the wafer along the modified layer (see Japanese Patent Laid-open No. 2005-95952, for example). According to this method, the focal point of a transmissive laser beam is set inside the wafer, and the laser beam is applied along each street of the wafer to thereby form the modified layer inside the wafer along each street. Thereafter, an external force is applied to the wafer to thereby break the wafer along the modified layer as an easily breakable area, thus dividing the wafer along each street to obtain a plurality of individual devices.

There is a case that the wafer is divided into a plurality of wafer strips along some of the streets before it is divided into the individual devices. In this case, each wafer strip is divided along the other streets to obtain a plurality of devices. FIG. 3A shows a wafer 1 to be divided into such a plurality of wafer strips, and FIG. 3B shows one of the wafer strips obtained by dividing the wafer 1 shown in FIG. 3A. As shown in FIG. 3A, the wafer 1 has a front side 1a, which is formed with a plurality of first streets 2 and a plurality of second streets 3 intersecting the first streets 2 at right angles to thereby partition a plurality of rectangular device forming areas 4 from each other. The wafer 1 is first divided along the first streets 2 to obtain the plural wafer strips. Thereafter, a laser beam is applied to each wafer strip 1 along the second streets 3, thereby forming a modified layer 5 (see FIGS. 4A and 4B) inside each wafer strip 1 along each second street 3. Thereafter, an external force is applied to each wafer strip 1 to divide it along the second streets 3, thus obtaining the individual devices. FIG. 4A is a plan view for illustrating a conventional dividing method in which a laser beam is applied from one end to the other end of each second street 3 of the wafer strip 1, and FIG. 4B is a cross section taken along the line A-A in FIG. 4A. As shown in FIGS. 4A and 4B, the modified layer 5 is formed along each second street 3 by applying the laser beam from one end 1b to the other end 1b of the wafer strip 1 along each second street 3. In this conventional dividing method, however, there is a possibility that the modified layer 5 inside the wafer strip 1 may be partially removed at the opposite ends 1b by ablation. As a result, debris 6 may be generated from the opposite ends 1b as shown in FIG. 4B, causing a degradation in quality of a device to be obtained.

This problem may be solved by another conventional dividing method shown in FIGS. 5A, 5B, and 5C. FIG. 5A is a plan view for illustrating such another conventional dividing method in which a laser beam is applied along each second street 3 of the wafer strip 1 except the opposite ends 1b of each second street 3, FIG. 5B is a cross section taken along the line B-B in FIG. 5A, and FIG. 5C is a plan view of a device 8 obtained by applying an external force to the wafer strip 1 shown in FIG. 5A. In this conventional dividing method, however, it is difficult to control the laser beam so as to stop the application of the laser beam just before the opposite ends 1b of the wafer strip 1. Further, as shown in FIG. 5B, each second street 3 of the wafer strip 1 has a pair of areas 7 where the modified layer 5 is not formed near the opposite ends 1b. In this case, there is a possibility that the device 8 obtained by applying an external force to the wafer strip 1 shown in FIGS. 5A and 5B may have chipping 9 such as burrs and cuts as shown in FIG. 5C.

SUMMARY OF THE INVENTION

It is therefore an object of the present invention to provide a wafer dividing method for dividing a wafer formed with a plurality of first and second crossing streets to partition a plurality of device forming areas from each other, wherein the wafer is first divided into a plurality of wafer strips along the first streets and each wafer strip can be reliably divided into a plurality of devices along the second streets.

In accordance with an aspect of the present invention, there is provided a wafer dividing method for dividing a wafer formed with a plurality of first streets and a plurality of second streets intersecting the first streets at right angles to thereby partition a plurality of device forming areas from each other, the wafer dividing method including a first modified layer forming step of applying a pulsed laser beam having a wavelength passing through the wafer to a specific area of each second street, the specific area extending by a predetermined distance from the point of intersection of each first street and each second street in opposite directions along each second street, thereby forming a first modified layer in the wafer along the specific area of each second street; a first dividing step of dividing the wafer along each first street to obtain a plurality of wafer strips; a second modified layer forming step of applying the pulsed laser beam along the remaining area of each second street where the first modified layer has not been formed in the first modified layer forming step, thereby forming a second modified layer along the remaining area of each second street; and a second dividing step of applying an external force to each wafer strip in which the first and second modified layers have been formed, thereby dividing each wafer strip along each second street to obtain a plurality of devices.

According to the wafer dividing method, the first modified layer is formed in only the specific area of each second street in the first modified layer forming step before performing the first dividing step for obtaining the wafer strips. The specific area of each second street corresponds to the opposite ends of each second street in each wafer strip. Accordingly, it is unnecessary to apply the laser beam to the opposite ends of each second street in each wafer strip in the second modified layer forming step. As a result, no debris is generated from the opposite ends of each wafer strip in the second modified layer forming step. Further, the first and second modified layers are formed along all area of each second street by the combination of the first modified layer forming step and the second modified layer forming step. As a result, the occurrence of chipping can be prevented and each wafer strip can be reliably divided along each second street.

Preferably, the first dividing step includes the steps of applying the pulsed laser beam along each first street, thereby forming a third modified layer in the wafer along each first street; and applying an external force to the wafer in which the third modified layer has been formed, thereby dividing the wafer along each first street to obtain the wafer strips. In this case, the first modified layer forming step and the formation of the third modified layer in the first dividing step can be performed by using the same processing apparatus, so that the wafer can be efficiently divided.

According to the present invention, the first modified layer forming step is performed prior to the first dividing step, thereby forming the first modified layer in the specific area corresponding to the opposite ends of each second street of each wafer strip to be obtained in the first dividing step. Accordingly, it is unnecessary to apply the laser beam to the opposite ends of each second street in the second modified layer forming step, thereby suppressing the generation of debris due to ablation. Further, the first and second modified layers are reliably formed along all area of each second street in the second modified layer forming step. Accordingly, the occurrence of chipping can be prevented and each wafer strip can be reliably divided along each second street.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described with reference to the drawings.

[1] Semiconductor Wafer

Figure 3A:
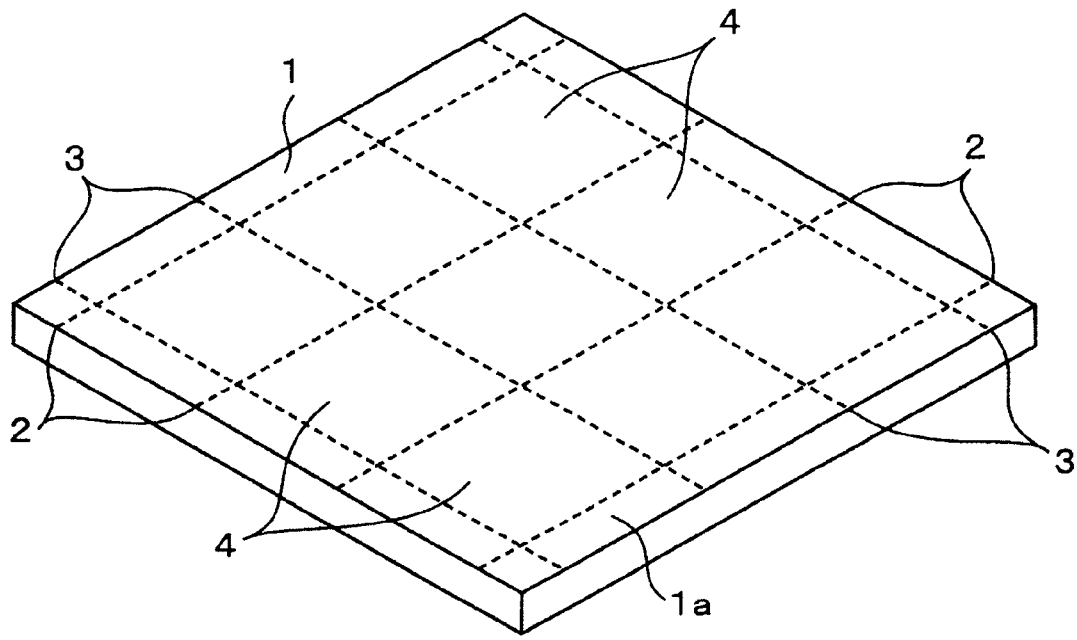
FIG. 3A is a perspective view of the wafer to be divided by the dividing method according to the preferred embodiment.
Figure 3B:
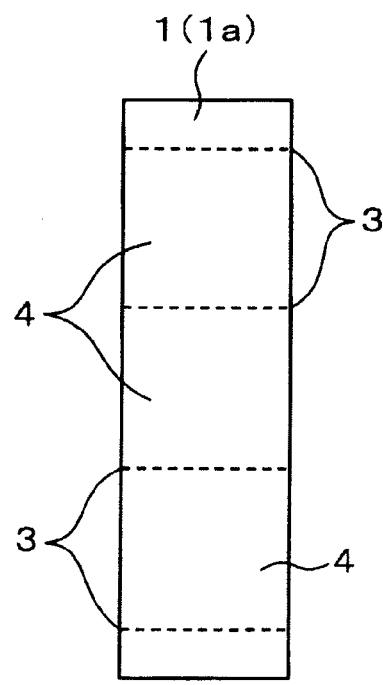
FIG. 3B is a plan view of the wafer strip obtained by the first dividing step of the dividing method according to the preferred embodiment.
Figure 4A:
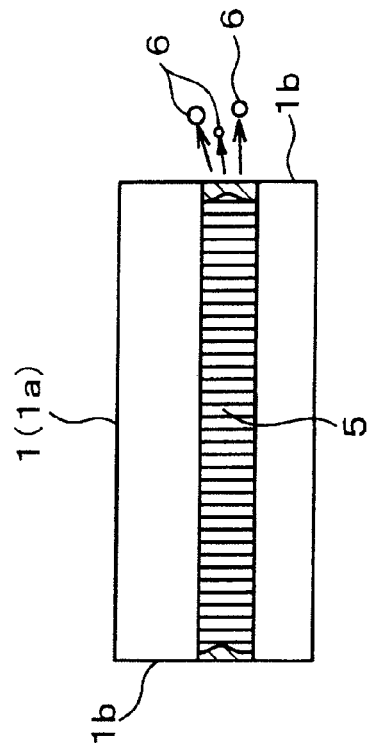
FIG. 4A is a plan view for illustrating a conventional dividing method in which a laser beam is applied from one end to the other end of each second street of a wafer strip.
Figure 4B:
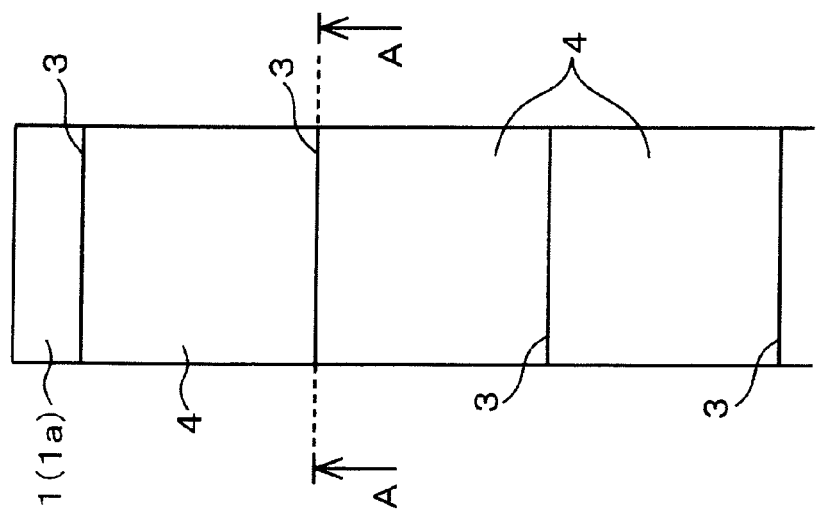
FIG. 4B is a cross section taken along the line A-A in FIG. 4A.
Figure 5B:
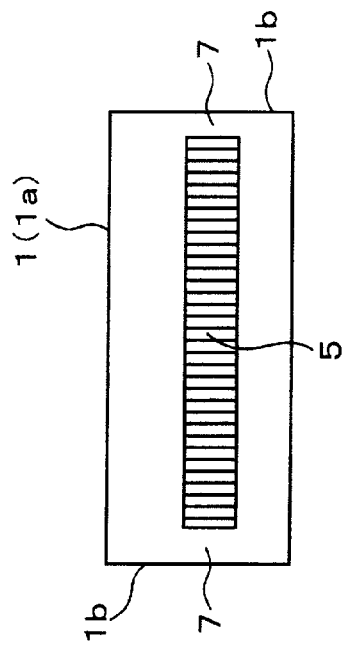
FIG. 5B is a cross section taken along the line B-B in FIG. 5A.
Figure 5C:
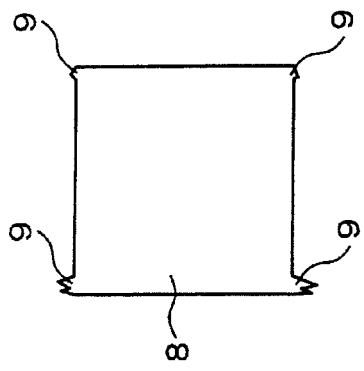
FIG. 5C is a plan view of a device obtained by applying an external force to the wafer strip shown in FIG. 5A.
Figure 5A:
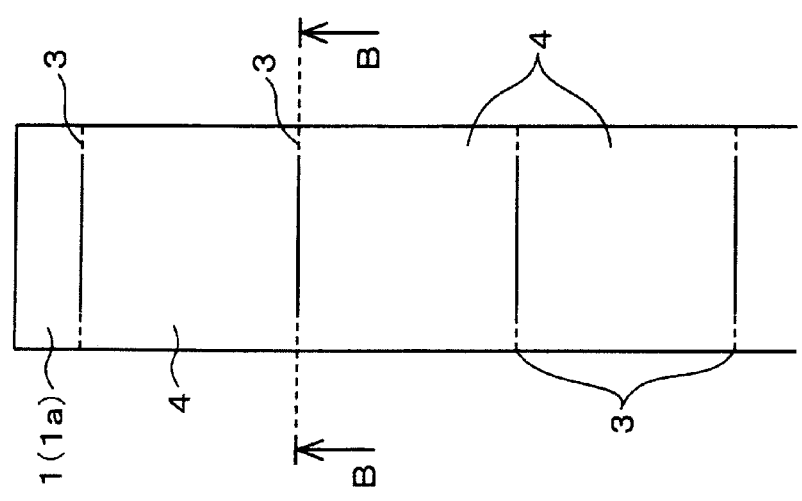
FIG. 5A is a plan view for illustrating another conventional dividing method in which a laser beam is applied along each second street of a wafer strip except the opposite ends of each second street.

This preferred embodiment relates to a method of suitably dividing the wafer 1 shown in FIG. 3A. The wafer 1 is a silicon wafer, for example. As described above, the front side 1*a* of the wafer 1 is formed with the first streets 2 and the second streets 3 intersecting the first streets 2 at right angles to thereby partition the plural rectangular device forming areas 4 from each other. In each device forming area 4, a TEG or element is laminated. The wafer 1 is finally divided along the streets 2 and 3 into a plurality of individual devices.

Figure 1:
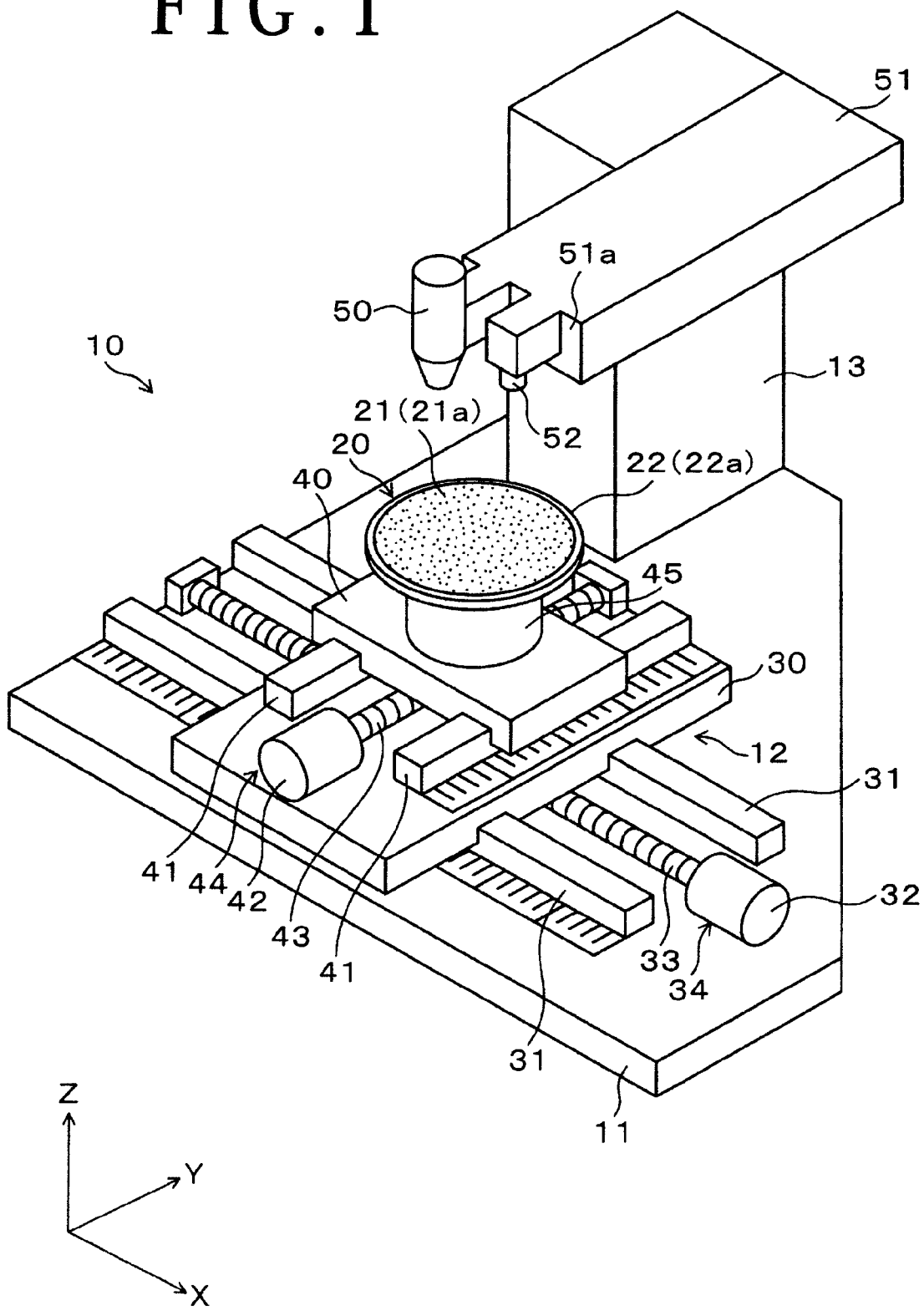
FIG. 1 is a perspective view of a dicing apparatus used to form a modified layer along each street of a wafer in a dividing method according to a preferred embodiment of the present invention.

In the dividing method according to this preferred embodiment, the focal point of a laser beam is set inside the wafer 1 and the laser beam is applied along the streets 2 and 3 of the wafer 1 to form a modified layer inside the wafer 1 along each of the streets 2 and 3. Thereafter, an external force is applied to the wafer 1 to thereby divide the wafer 1 into the individual devices. As an apparatus for forming such a modified layer in the wafer 1, a laser type dicing apparatus 10 shown in FIG. 1 is suitably used. The configuration and operation of the dicing apparatus 10 will now be described.

[2] Dicing Apparatus

The dicing apparatus 10 includes a horizontal chuck table 20 for holding the wafer 1 thereon. A laser head 50 for directing a laser beam vertically downward is provided above the chuck table 20. The dicing apparatus 10 has a horizontal base 11 and an XY moving table 12 supported to the horizontal base 11 so as to be movable in an X direction shown by an arrow X in FIG. 1 and in a Y direction shown by an arrow Y in FIG. 1. The chuck table 20 is mounted on the XY moving table 12. By moving the XY moving table 12 in the X direction and the Y direction, the laser beam directed from the laser head 50 can be applied along the streets 2 and 3 of the wafer 1 held on the chuck table 20.

The XY moving table 12 is composed of an X-axis base 30 supported to the base 11 so as to be movable in the X direction and a Y-axis base 40 supported to the X-axis base 30 so as to be movable in the Y direction. The X-axis base 30 is slidably mounted on a pair of parallel guide rails 31 fixed to the base 11 and extending in the X direction. The X-axis base 30 is moved in the X direction by an X-axis driving mechanism 34 including a motor 32 and a ball screw 33 rotationally driven by the motor 32. On the other hand, the Y-axis base 40 is slidably mounted on a pair of parallel guide rails 41 fixed to the X-axis base 30 and extending in the Y direction. The Y-axis base 40 is moved in the Y direction by a Y-axis driving mechanism 44 including a motor 42 and a ball screw 43 rotationally driven by the motor 42.

The chuck table 20 is of a vacuum chuck type well known in the art. That is, the wafer 1 is held on the chuck table 20 by suction vacuum. The chuck table 20 has a circular suction area 21 formed of porous ceramic, and the suction area 21 has an upper surface 21*a* for holding the wafer 1 by suction vacuum. An annular frame 22 is formed around the suction area 21. The annular frame 22 has an upper surface 22*a* continuing to the upper surface 21*a* of the suction area 21 in a flush manner. The chuck table 20 is rotatably supported through a cylindrical support member 45 to the Y-axis base 40. The chuck table 20 is rotated in one direction or both directions by a rotational driving mechanism (not shown). Further, the chuck table 20 is moved in the X direction and the Y direction by the movement of the X-axis base 30 and the Y-axis base 40.

By rotating the chuck table 20, the wafer 1 held on the chuck table 20 is rotated to make either the streets 2 or the streets 3 parallel to the X direction, so that the other streets 3 or 2 orthogonal to the streets 2 or 3 extending in the X direction become parallel to the Y direction. By stopping the rotation of the chuck table 20, the above condition of the wafer 1 is fixed. As suitably moving the X-axis base 30 and the Y-axis base 40 of the XY moving table 12 in the above fixed condition of the wafer 1, the laser beam is applied from the laser head 50 along the streets 2 and 3 of the wafer 1. In this preferred embodiment, the focal point of the laser beam is set directly below each of the streets 2 and 3 to form the modified layer along each of the streets 2 and 3.

The laser head 50 is provided on an end surface 51a of a casing 51 extending in the Y direction toward the upper side of the chuck table 20. A column 13 is provided on the upper surface of the base 11, and the casing 51 is supported to the column 13 so as to be movable in a vertical direction (Z direction) shown by an arrow Z in FIG. 1. That is, the casing 51 is vertically movable by a vertical driving mechanism (not shown) provided in the column 13. A pulsed laser oscillator such as a YAG laser oscillator or a YVO4 laser oscillator is connected to the laser head 50. Laser oscillated by the pulsed laser oscillator is directed vertically downward as a laser beam from the laser head 50.

For example, the laser beam is applied to the wafer 1 under the following conditions.

Light Source: LD pumped Q-switched Nd:YVO4 pulsed laser
  Wavelength: 1064 nm
  Repetition Frequency: 100 kHz
  Pulse Width: 40 ns
  Average Power: 1 W
  Focused Spot Diameter: ϕ1 μm
  Work Feed Speed: 100 mm/sec The applied position of the laser beam from the laser head 50 is controlled according to an image obtained by a microscope 52 mounted on the end surface 51a of the casing 51 so as to be juxtaposed to the laser head 50. The microscope 52 is vertically movable together with the laser head 50 by the vertical movement of the casing 51, thereby adjusting the focal point of the laser beam. Prior to application of the laser beam, the wafer 1 held on the chuck table 20 is moved to a position below the microscope 52, and a pattern image of the front side 1a of the wafer 1 is obtained by the microscope 52. The pattern image thus obtained is input into image processing means (not shown) to detect the streets 2 and 3 to be cut and also to control the rotation of the chuck table 20 in making the streets 2 and 3 parallel to the X and Y directions. Further, the movement of the chuck table 20 and the XY moving table 12 and the application of the laser beam from the laser head 50 are also controlled according to the data on the streets 2 and 3 detected by the image processing means.

In the dicing apparatus 10 mentioned above, the laser beam is applied from the laser head 50 along the streets 2 or 3 extending parallel to the X direction as moving the X-axis base 30 in the X direction, thereby forming a modified layer along each of the streets 2 or 3 extending parallel to the X direction. Similarly, the laser beam is applied from the laser head 50 along the other streets 3 or 2 extending parallel to the Y direction as moving the Y-axis base 40 in the Y direction, thereby forming a modified layer along each of the other streets 3 or 2 extending parallel to the Y direction. Alternatively, after forming a modified layer along each of the streets 2 or 3 extending parallel to the X direction, the chuck table 20 may be rotated 90° to make the other streets 3 or 2 parallel to the X direction. Thereafter, the laser beam may be applied along the other streets 3 or 2 as moving the X-axis base 30 in the X direction. In applying the laser beam, the casing 51 is vertically moved to adjust the vertical position of the laser head 50, thereby setting the focal point of the laser beam directly below each of the streets 2 and 3.

After forming a modified layer along each of the streets 2 and 3 by the application of the laser beam to the wafer 1, the wafer 1 is removed from the chuck table 20. Thereafter, the wafer 1 is transported to a breaking apparatus. That is, an external force is applied from the breaking apparatus to the wafer 1 having the modified layer formed by the application of the laser beam, thereby dividing the wafer 1 into individual devices along the modified layers formed below the streets 2 and 3.

[3] Dividing Method

Figure 2A:
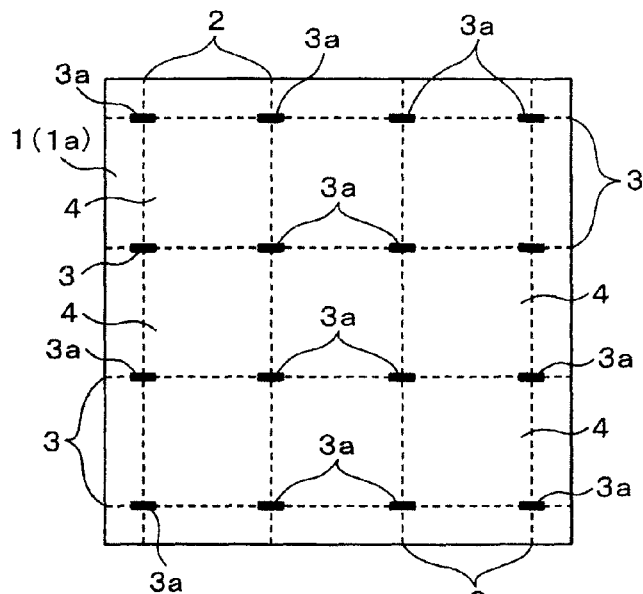
FIG. 2A is a plan view for illustrating a first modified layer forming step of the dividing method according to the preferred embodiment.
Figure 2B:
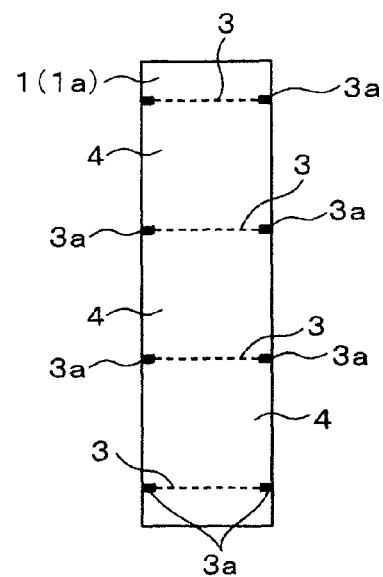
FIG. 2B is a plan view for illustrating a wafer strip obtained by a first dividing step of the dividing method according to the preferred embodiment.

The dividing method according to this preferred embodiment will now be described with reference to FIGS. 2A to 2E. First, the laser beam is applied to only an area of each second street 3 intersecting each first street 2 in the wafer 1 by using the dicing apparatus 10 (which area will be hereinafter referred to as an intersection area 3a) (first modified layer forming step). That is, the intersection area 3a of each second street 3 extends by a predetermined distance from the point of intersection in opposite directions along each second street 3. As a result, a modified layer is formed in only each intersection area 3a as shown in FIG. 2A. Thereafter, the wafer 1 is divided along each first street 2 to obtain a wafer strip 1 having an oblong shape as shown in FIG. 2B (first dividing step). In the first dividing method, the laser beam is applied along the first streets 2 of the wafer 1 to form a modified layer along each first street 2. The strength of the wafer 1 is reduced in proportion to the length of each street along which a modified layer is formed. In other words, the shorter each street along which a modified layer is formed, the larger the strength of the wafer 1 in the condition where the modified layer is formed. In the first modified layer forming step of the dividing method according to this preferred embodiment, a modified layer is formed in only each intersection area 3a as a minimum area required for suppression of the generation of debris due to ablation. As a result, a reduction in strength of the wafer 1 after the first modified layer forming step can be suppressed as compared with the case that a modified layer is formed along all area of each second street 3 before the first dividing step.

Thereafter, an external force is applied to the wafer 1 in which the modified layer has been formed along each first street 2, thereby dividing the wafer 1 into a plurality of wafer strips, one of which is shown in FIG. 2B. As a method of applying an external force to the wafer 1, the use of a breaking apparatus is known, wherein the wafer 1 is held through an adhesive tape to a ringlike frame and the wafer 1 is next expanded. While an external force is applied to the wafer 1 to divide it into the wafer strips after forming the modified layer by using the dicing apparatus 10 in this preferred embodiment, any means capable of dividing the wafer 1 along the first streets 2 may be used. For example, a dicer using a cutting blade may be used.

After obtaining the wafer strip 1 shown in FIG. 2B, any element is laminated on each device forming area 4 of the wafer strip 1 according to the specifications of each device.

Figure 2C:
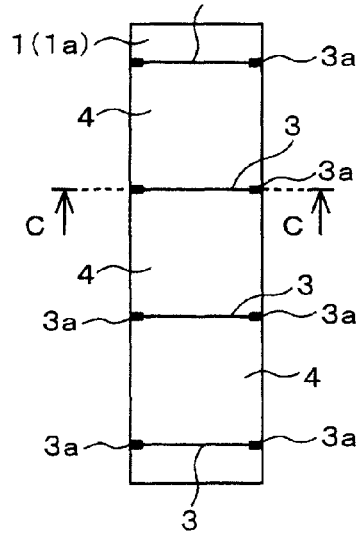
FIG. 2C is a plan view for illustrating a second modified layer forming step of the dividing method according to the preferred embodiment.
Figure 2D:
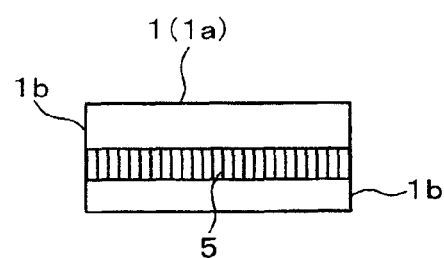
FIG. 2D is a cross section taken along the line C-C in FIG. 2C.

Thereafter, the laser beam is applied along the remaining area of each second street 3 where the modified layer has not been formed in the first modified layer forming step, that is, along the intermediate area of each second street 3 between the opposite intersection areas 3a, thereby forming a modified layer along the remaining area of each second street 3 (second modified layer forming step). In the second modified layer forming step, the laser beam is applied to the wafer strip 1 along the minimum area of each second street 3 required for reliable breaking of the wafer strip 1 along each second street 3. As a result, a modified layer 5 is formed along each second street 3 as shown in FIGS. 2C and 2D. Thereafter, an external force is applied to the wafer strip 1 as in the first dividing step. As a result, the wafer strip 1 is divided along each second street 3 to obtain a device 8 shown in FIG. 2E (second dividing step).

Figure 2E:
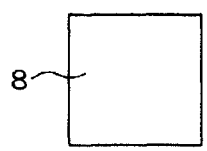
FIG. 2E is a plan view for illustrating a device obtained by a second dividing step of the dividing method according to the preferred embodiment.

As described above, the modified layer is formed in only the intersection areas 3a of each second street 3 in the first modified layer forming step before performing the first dividing step for obtaining the wafer strip 1. Accordingly, it is unnecessary to apply the laser beam to the opposite ends 1b of each second street 3 of the wafer strip 1 in the second modified layer forming step. As a result, no debris is generated from the opposite ends 1b of the wafer strip 1 in the second modified layer forming step. Further, the modified layer 5 is formed along all area of each second street 3 as shown in FIG. 2D by the combination of the first modified layer forming step and the second modified layer forming step. As a result, the wafer strip 1 can be reliably divided along each second street 3, and the resultant device 8 has no chipping as shown in FIG. 2E.

Further, in the first dividing step of the dividing method according to this preferred embodiment, the laser beam is applied along each first street 2 to form a modified layer along each first street 2. Thereafter, an external force is applied to the wafer 1 in which the modified layer has been formed, thereby dividing the wafer 1 along each first street 2 to obtain a wafer strip. Accordingly, the first modified layer forming step and the formation of the modified layer in the first dividing step can be performed by using the same dicing apparatus 10. As a result, the wafer 1 can be efficiently divided.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method for dividing a wafer formed with a plurality of first streets and a plurality of second streets intersecting said first streets at right angles to thereby partition a plurality of device forming areas from each other, said wafer dividing method comprising:
   a first modified layer forming step of applying a pulsed laser beam having a wavelength which has a permeability to said wafer to a specific area of each second street, said specific area extending by a predetermined distance from the point of intersection of each first street and each second street in opposite directions along each second street, thereby forming a first modified layer in said wafer along said specific area of each second street;
   a first dividing step of dividing said wafer along each first street to obtain a plurality of wafer strips;
   a second modified layer forming step of applying said pulsed laser beam along the remaining area of each second street where said first modified layer has not been formed in said first modified layer forming step, thereby forming a second modified layer along the remaining area of each second street; and
   a second dividing step of applying an external force to each wafer strip in which said first and second modified layers have been formed, thereby dividing each wafer strip along each second street to obtain a plurality of devices.

2. The wafer dividing method according to claim 1, wherein said first dividing step comprises the steps of:
   applying said pulsed laser beam along each first street, thereby forming a third modified layer in said wafer along each first street; and
   applying an external force to said wafer in which said third modified layer has been formed, thereby dividing said wafer along each first street to obtain said wafer strips.

* * * * *